United States Patent
Han et al.

(10) Patent No.: US 12,089,479 B2
(45) Date of Patent: Sep. 10, 2024

(54) DISPLAY DEVICE AND METHOD FOR MANUFACTURING THE SAME, AND ELECTRONIC APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Linhong Han, Beijing (CN); Yi Zhang, Beijing (CN); Youngyik Ko, Beijing (CN); Shun Zhang, Beijing (CN); Shikai Qin, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 692 days.

(21) Appl. No.: 17/278,816

(22) PCT Filed: May 18, 2020

(86) PCT No.: PCT/CN2020/090791
§ 371 (c)(1),
(2) Date: Mar. 23, 2021

(87) PCT Pub. No.: WO2021/232185
PCT Pub. Date: Nov. 25, 2021

(65) Prior Publication Data
US 2022/0115464 A1    Apr. 14, 2022

(51) Int. Cl.
*H01L 27/32*    (2006.01)
*H01L 51/00*    (2006.01)
(Continued)

(52) U.S. Cl.
CPC ........... *H10K 59/88* (2023.02); *H10K 59/131* (2023.02); *H10K 71/00* (2023.02); *H10K 77/111* (2023.02);
(Continued)

(58) Field of Classification Search
CPC ............ H10K 77/111; H10K 2102/311; H10K 71/00; H10K 71/70; H10K 59/1201;
(Continued)

(56) References Cited

U.S. PATENT DOCUMENTS 10,210,782 B2    2/2019    Lee et al.
10,692,412 B2    6/2020    Lee et al.
(Continued)

FOREIGN PATENT DOCUMENTS

CN    107680481 A    2/2018
CN    109427273 A    3/2019
(Continued)

OTHER PUBLICATIONS

Communication pursuant to Article 94(3) EPC, dated May 8, 2023, for corresponding European Application No. 20900703.8.
(Continued)

*Primary Examiner* — Victor A Mandala
*Assistant Examiner* — Lawrence C Tynes, Jr.
(74) *Attorney, Agent, or Firm* — Kinney & Lange, P.A.

(57) ABSTRACT

The present disclosure provides a display device and a method for manufacturing the same, and an electronic apparatus. The display device includes: a display panel including a display area and a peripheral area; a crack detection line in the peripheral area and surrounding the display area, the crack detection line includes a first wire segment and a second wire segment; and a circuit board, the circuit board includes a plurality of connection lines and an integrated circuit, the plurality of connection lines includes
(Continued)

at least one first connection line, at least one second connection line, and at least one third connection line; the first connection line electrically connects the first wire segment and the second wire segment, the second connection line electrically connects the first wire segment and the integrated circuit, and the at least one third connection line electrically connects the second wire segment and the integrated circuit.

19 Claims, 10 Drawing Sheets

(51) Int. Cl.
    H01L 51/56      (2006.01)
    H10K 59/131     (2023.01)
    H10K 59/88      (2023.01)
    H10K 71/00      (2023.01)
    H10K 77/10      (2023.01)
    H10K 59/12      (2023.01)
    H10K 102/00     (2023.01)
(52) U.S. Cl.
    CPC .... *H10K 59/1201* (2023.02); *H10K 2102/311* (2023.02)
(58) Field of Classification Search
    CPC ...... H10K 59/131; Y02E 10/549; G09G 3/00; G09G 3/006; G09G 2330/12
    See application file for complete search history.

(56) References Cited

U.S. PATENT DOCUMENTS

| | | |
|---|---|---|
| 10,861,361 B2 | 12/2020 | Kim et al. |
| 10,963,111 B1 | 3/2021 | Xiao et al. |
| 11,335,714 B2 | 5/2022 | Li et al. |
| 2018/0053466 A1 | 2/2018 | Zhang et al. |
| 2019/0057632 A1 | 2/2019 | Kim et al. |
| 2019/0392743 A1 | 12/2019 | Lee et al. |
| 2020/0265783 A1* | 8/2020 | Lee ................... G09G 3/3266 |
| 2020/0295114 A1* | 9/2020 | Moon .................... H10K 59/88 |
| 2021/0026176 A1* | 1/2021 | Toyotaka .............. G02F 1/1368 |
| 2021/0225896 A1 | 7/2021 | Li et al. |

FOREIGN PATENT DOCUMENTS

| | | | | |
|---|---|---|---|---|
| CN | 209132559 U | 7/2019 | | |
| CN | 110494912 A | 11/2019 | | |
| CN | 110851016 A | 2/2020 | | |
| CN | 110910801 A | 3/2020 | | |
| CN | 111048022 A | * 4/2020 | ............ | G09G 3/006 |
| EP | 3330951 A2 | 6/2018 | | |
| EP | 3573045 A1 | 11/2019 | | |

OTHER PUBLICATIONS

Extended European Search Report dated Sep. 28, 2022, for corresponding European Application No. 20900703.8.

* cited by examiner

DISPLAY DEVICE AND METHOD FOR MANUFACTURING THE SAME, AND ELECTRONIC APPARATUS

CROSS-REFERENCE TO RELATED APPLICATION(S)

This application is a Section 371 National Stage Application of International Application No. PCT/CN2020/090791 filed on May 18, 2020, the disclosure of which is incorporated by reference herein in its entirety.

TECHNICAL FIELD

The present disclosure relates to a field of display technology, and in particular to a display device, a method for manufacturing the display device, and an electronic apparatus.

BACKGROUND

Display panels in display devices, especially flexible display panels, are prone to cracks. Although some cracks do not affect a display effect of the display panel at that time, as subsequent processes proceed, changes in environmental factors of the display panel may aggravate the cracks, resulting in a reduction in a quality of the display panel, and may greatly affect the display effect of the display panel in later stages. Therefore, it is very important to detect display panels with cracks in time during manufacturing process stages.

SUMMARY

The present disclosure provides a display device, a method for manufacturing the display device, and an electronic apparatus.

According to an aspect of the embodiments of the present disclosure, there is provided a display device comprising: a display panel comprising a display area and a peripheral area surrounding the display area; a crack detection line in the peripheral area and surrounding the display area, wherein the crack detection line comprises a first wire segment and a second wire segment; and a circuit board on a side of the display panel and at least partially overlaps the display panel, wherein the circuit board comprises a plurality of connection lines and an integrated circuit, and the plurality of connection lines comprises at least one first connection line, at least one second connection line, and at least one third connection line; wherein the at least one first connection line electrically connects the first wire segment and the second wire segment, the at least one second connection line electrically connects the first wire segment and the integrated circuit, and the at least one third connection line electrically connects the second wire segment and the integrated circuit.

For example, the display device further comprises: a first pin, a second pin, a third pin, and a fourth pin between the crack detection line and the plurality of connection lines, and the plurality of connection lines comprise a first connection line, a second connection line, and a third connection line; wherein a first end of the first wire segment is electrically connected to the first pin, and a second end of the first wire segment is electrically connected to the second pin; and a first end of the second wire segment is electrically connected to the fourth pin, and a second end of the second wire segment is electrically connected to the third pin; and wherein the second pin and the third pin are electrically connected to each other through the first connection line; the first pin is electrically connected to a first test terminal of the integrated circuit through the second connection line; and the fourth pin is electrically connected to a second test terminal of the integrated circuit through the third connection line.

For example, the circuit board further comprises: a first circuit board and a second circuit board, and the second circuit board is on a side of the first circuit board away from the display panel and at least partially overlaps the first circuit board; and wherein the integrated circuit, the second connection line, and the third connection line are on the first circuit board.

For example, the second pin and the third pin are between the first pin and the fourth pin; and wherein the first connection line is in an area of the first circuit board surrounded by the first pin, the second pin, the third pin, the fourth pin, the second connection line, the third connection line, and the integrated circuit.

For example, the first pin and the fourth pin are between the second pin and the third pin; and wherein the first connection line comprises a fourth connection line, a fifth connection line, and a sixth connection line that are electrically connected in sequence, and the fourth connection line and the sixth connection line are on the first circuit board, and the fifth connection line is on the second circuit board.

For example, the display device further comprises a fifth pin and a sixth pin on the second circuit board; and wherein a first end of the fourth connection line is electrically connected to the second pin, and a second end of the fourth connection line is electrically connected to the fifth pin; a first end of the fifth connection line is electrically connected to the fifth pin, and a second end of the fifth connection line is electrically connected to the sixth pin; and a first end of the sixth connection line is electrically connected to the sixth pin, and a second end of the sixth connection line is electrically connected to the third pin.

For example, the display device further comprises a seventh pin and an eighth pin on the first circuit board away from the display panel; and wherein the second end of the fourth connection line is electrically connected to the seventh pin, and the first end of the sixth connection line is electrically connected to the eighth pin; and wherein the seventh pin and the eighth pin are electrically connected to the fifth pin and the sixth pin, respectively.

For example, the second circuit board is a flexible circuit board.

For example, the flexible circuit board comprises a flexible substrate, and the fifth connection line is on the flexible substrate.

For example, the flexible circuit board comprises a protective layer covering the fifth connection line.

For example, the protective layer is made of a nickel material.

For example, the first connection line, the second connection line, and the third connection line are made of a copper material.

For example, the display area comprises a first boundary, a second boundary, a third boundary, and a fourth boundary that are sequentially connected; and wherein the first wire segment is in the peripheral area close to the first boundary, the second boundary, and the third boundary; the second wire segment is in the peripheral area close to the first boundary, the fourth boundary, and the third boundary; and the first wire segment and the second wire segment are symmetrically arranged; and wherein the first circuit board is in the peripheral area close to the third boundary, and the first pin, the second pin, the third pin, and the fourth pin are on the first circuit board.

For example, the first wire segment is bent to form a first double-fold line, and the second wire segment is bent to form a second double-fold line; and wherein a bending point of the first double-fold line is in the peripheral area close to the first boundary, and a first end of the first double-fold line and a second end of the first double-fold line are in the peripheral area close to the third boundary; and a bending point of the second double-fold line is in the peripheral area close to the first boundary, and a first end of the second double-fold line and a second end of the second double-fold line are in the peripheral area close to the third boundary.

For example, the display device further comprises a ninth pin, a tenth pin, an eleventh pin, and a twelfth pin on the display panel close to the third boundary; and wherein the first end of the first wire segment and the second end of the first wire segment are electrically connected to the ninth pin and the tenth pin, respectively; and the first end of the second wire segment and the second end of the second wire segment are electrically connected to the eleventh pin and the twelfth pin, respectively; and wherein the ninth pin, the tenth pin, the eleventh pin, and the twelfth pin are electrically connected to the first pin, the second pin, the third pin, and the fourth pin, respectively.

For example, the display panel further comprises a plurality of detection switches and a plurality columns of pixels, and the plurality columns of pixels are in the display area, and the plurality of detection switches are electrically connected to the plurality columns of pixels and the crack detection line; and wherein first electrodes of a part of the plurality of detection switches are electrically connected to the first wire segment, and first electrodes of the other part of the plurality of detection switches are electrically connected to the second wire segment; and second electrodes of the plurality of detection switches are electrically connected to the plurality columns of pixels; and wherein the circuit board further comprises a thirteenth pin and a fourteenth pin on a side of the crack detection line away from the display area, and wherein control electrodes of the plurality of detection switches are electrically connected to the thirteenth pin and the fourteenth pin.

For example, the circuit board further comprises a seventh connection line and an eighth connection line; and wherein the thirteenth pin is electrically connected to a first control terminal of the integrated circuit through the seventh connection line; and the fourteenth pin is electrically connected to a second control terminal of the integrated circuit through the eighth connection line.

According to another aspect of the embodiments of the present disclosure, there is provided a method for manufacturing the display device according to any of the above embodiments, the method comprising: manufacturing a display panel comprising a display area and a peripheral area surrounding the display area; providing a crack detection line surrounding the display area on the peripheral area, wherein the crack detection line comprises a first wire segment and a second wire segment; manufacturing a circuit board, wherein the circuit board comprises a plurality of connection lines and an integrated circuit, and the plurality of connection lines comprise at least one first connection line, at least one second connection line, and at least one third connection line; and bonding the circuit board to the display panel to cause the circuit board to be on a side of the display panel and at least partially overlap the display panel, wherein the at least one first connection line electrically connects the first wire segment and the second wire segment, the at least one second connection line electrically connects the first wire segment and the integrated circuit, and the at least one third connection line electrically connects the second wire segment and the integrated circuit.

According to an aspect of the embodiments of the present disclosure, there is provided an electronic apparatus comprising the display device according to any of the above embodiments.

BRIEF DESCRIPTION OF THE DRAWINGS

In order to explain the embodiments of the present disclosure or the traditional technical solutions more clearly, the following will briefly introduce the drawings that need to be used in the description of the embodiments. Obviously, the drawings in the following description are only some embodiments of the present disclosure. For those of ordinary skill in the art, other drawings may be obtained from these drawings without creative work. In figures below.

DETAILED DESCRIPTION OF EMBODIMENTS

Figure 1A:
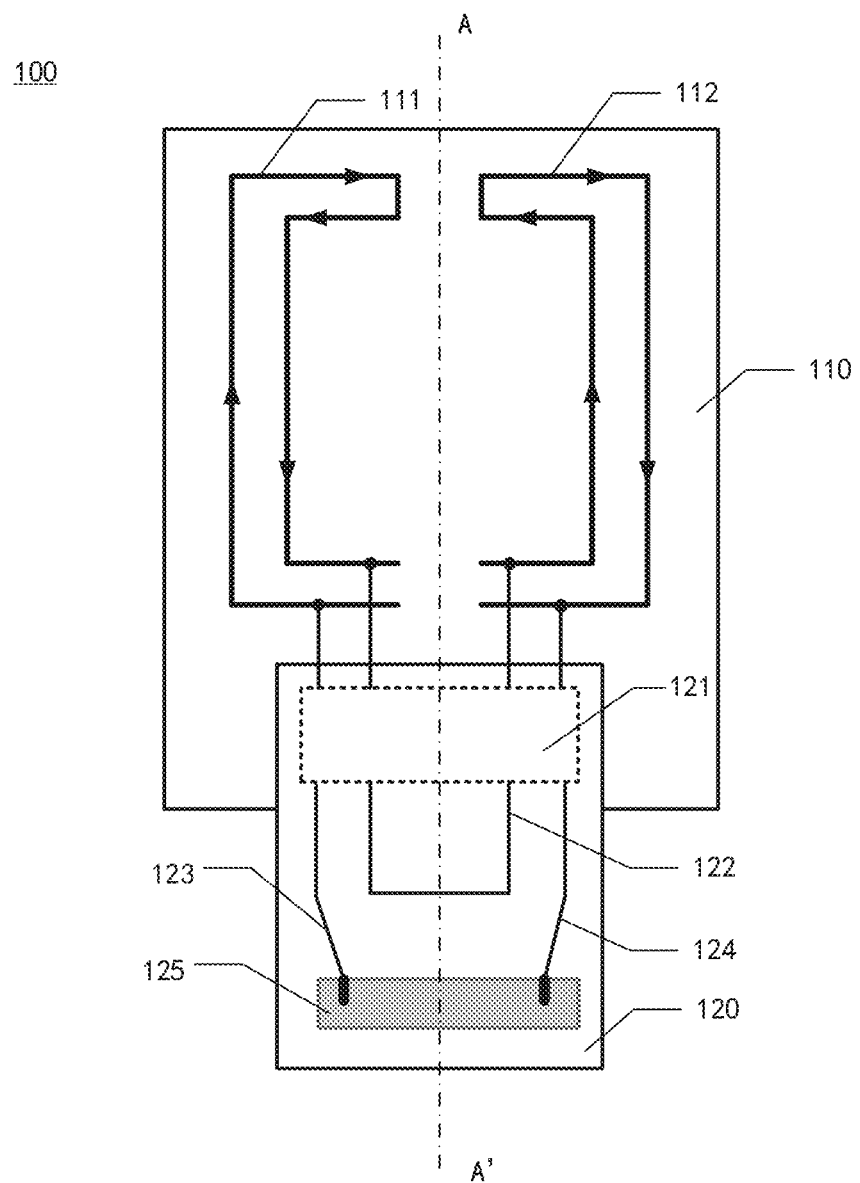
FIG. 1A schematically shows an example structure diagram of a display device according to an embodiment of the present disclosure.

In order to make the objectives, technical solutions, and advantages of the embodiments of the present disclosure clearer, the technical solutions in the embodiments of the present disclosure will be described clearly and completely in conjunction with the drawings in the embodiments of the present disclosure. Obviously, the described embodiments are part of the embodiments of the present disclosure, but not all of them. Based on the described embodiments of the present disclosure, all other embodiments obtained by those of ordinary skill in the art without creative labor are within the protection scope of the present disclosure. It should be noted that throughout the drawings, the same elements are represented by the same or similar reference signs. In the following description, some specific embodiments are only used for descriptive purposes, and should not be construed as limiting the present disclosure, but are merely examples of embodiments of the present disclosure.

When it may cause confusion in the understanding of the present disclosure, conventional structures or configurations will be omitted. It should be noted that the shape and size of each component in the figure do not reflect the actual size and ratio, but merely illustrate the content of the embodiment of the present disclosure.

Unless otherwise defined, the technical or scientific terms used in the embodiments of the present disclosure should have the usual meanings understood by those skilled in the art. The "first", "second" and similar words used in the embodiments of the present disclosure do not indicate any order, quantity, or importance, but are only used to distinguish different components.

In addition, in the description of the embodiments of the present disclosure, the term "connected" or "connected to" may mean that two components are directly connected, or that two components are connected via one or more other components. In addition, these two components may be connected or coupled by wired or wireless means.

Display panels in display devices, especially flexible display panels, are prone to cracks. A flexible AMOLED (Active Matrix Organic Light Emitting Diode) display panel is taken as an example, as the flexible AMOLED display panel has a bendable performance, it is susceptible to external stress, which causes cracks at edges to cause an irreversible damage to the display panel. In addition, during a manufacturing process of the flexible display panel, under influence of a certain process, the edges of the display panel are also prone to cracks. Although some cracks do not affect the display effect of the display panel at that time, as subsequent processes proceed, changes in environmental factors (such as a temperature, a vibration, a stress, etc.) of the display panel may aggravate the cracks, resulting in a decrease in a quality of the display panel. A later stage may greatly affect the display effect of the display panel. Therefore, it is very important to detect the display panel with cracks in time during the manufacturing process.

For example, a crack detection unit (Panel Crack Detector, PCD) may be provided in a display panel to detect small cracks generated on the display panel. A basic principle of crack detection is to provide a detection loop on the display panel. When the display panel has a crack, the detection loop may be disconnected, so that whether a crack exists on the display panel or not may be determined by testing whether the detection loop has a breakpoint or not. However, in most solutions, connection lines of the detection loop are arranged in the display panel, occupying a large amount of space in the display panel, which limits the design of the display panel; in addition, due to the space in the display panel is compact, the connection lines in the detection loop may generate static electricity with other devices in the display panel, which may affect the display effect of the display panel.

According to an embodiment of the present disclosure, a display device is provided. The display device is provided with a detection loop for crack detection on the display panel. A connection line in the detection loop is arranged outside the display panel, so as to ensure a crack detection effect while minimizing an impact of a spatial layout of the detection loop on the display panel. The display device according to an embodiment of the present disclosure may be exemplarily described below with reference to the accompanying drawings.

FIG. 1A schematically shows an exemplary structure diagram of a display device according to an embodiment of the present disclosure.

As shown in FIG. 1A, the display device 100 may include a display panel 110 and a circuit board 120.

The display panel 110 is provided with a crack detection line, for example, the crack detection line may include a plurality of wire segments 111 and 112. The circuit board 120 is provided with a bonding area 121, a plurality of connection lines 122 to 124, and a detection circuit 125. For example, an integrated circuit (IC) 125 in the display device may be directly used as the detection circuit 125. The plurality of connection lines 122 to 124 may have various layouts. For example, in FIG. 1A, the connection line 122 is arranged in an area of the circuit board 120 surrounded by the bonding area 121, the connection line 123, the connection line 124, and the integrated circuit 125. In other embodiments, the connection line 122 is arranged on the circuit board 120 around the connection line 123, the connection line 124, and the integrated circuit 125. The bonding area 121 of the circuit board 120 and the display panel 110 may be bonded through a predetermined process, so that the bonding area 121 of the circuit board 120 is electrically connected to the wire segments 111 and 112 in the display panel 110. The connection lines 122 to 124 and the integrated circuit 125 are all located on a side of the circuit board 120 away from a display area.

Exemplarily, at least one connection line (for example, the connection line 122) in the circuit board 120 electrically connects the wire segments 111 and 112 on the display panel 110 to each other through the bonding area 121 to form a conductive path, for example, the conductive path in FIG. 1A is marked by an arrow. At least two connection lines (for example, the connection line 123 and the connection line 124) in the circuit board 120 electrically connect the conductive path and the integrated circuit 125 through the bonding area 121 to form a detection loop. For example, the connection line 123 electrically connects one end of the conductive path to the integrated circuit 125 through the bonding area 121, and the connection line 124 electrically connects the other end of the conductive path to the integrated circuit 125 through the bonding area 121. Thus, for example, a detection loop starting from the integrated circuit 125, passing through the connection line 123, passing through the above-mentioned conductive path, and then returning to the integrated circuit 125 after passing through the connection line 124 is formed. A specific electrical connection method may be described later. The integrated circuit 125 is used to determine whether a breakpoint exists in the above-mentioned conductive path or not. For example, the integrated circuit 125 may transmit a first signal to one end of the conductive path, and then receive a second signal from the other end of the conductive path, and determine whether a breakpoint exists in the conductive path or not according to a difference between the first signal and the second signal, and if yes, it means that the above-mentioned conductive path is broken due to a crack generated on the display panel 110, that is, it is determined that the display panel 110 has a crack.

It should be noted that in the above embodiment, two wire segments and three connection lines are taken as examples for description. In other examples, more than two wire segments may be provided on the display panel 110 as required. Accordingly, more connection lines may be provided on the circuit board 120, and the embodiments of the present disclosure does not limit to this, as long as these wire segments and connection lines may form a detection loop with the integrated circuit 125 through the connection of the bonding area 121.

According to a technical solution of the embodiments of the present disclosure, the connecting wires and the integrated circuit in a detection loop for detecting cracks of the display panel are all arranged on the circuit board located outside the display panel. A layout of the connecting lines in the integrated circuit and the integrated circuit does not occupy a space of the display panel, which increases design flexibility of the display panel, and at the same time reduces an influence caused by static electricity between the connecting lines and the devices in the display panel.

Those skilled in the art may understand that, according to the display device of an embodiment of the present disclosure, the electrical connection of the wire segment used for crack detection of the display panel is realized on the circuit board outside the display panel, for example, the connection lines used to connect the wire segments are all located in an area of the circuit board except for the bonding area. In this way, the connection lines used to connect the wire segments no longer occupy a space of the display panel, which increases the flexibility of the display panel design and reduces an influence of the connection lines on the devices in the display panel.

Figure 1B:
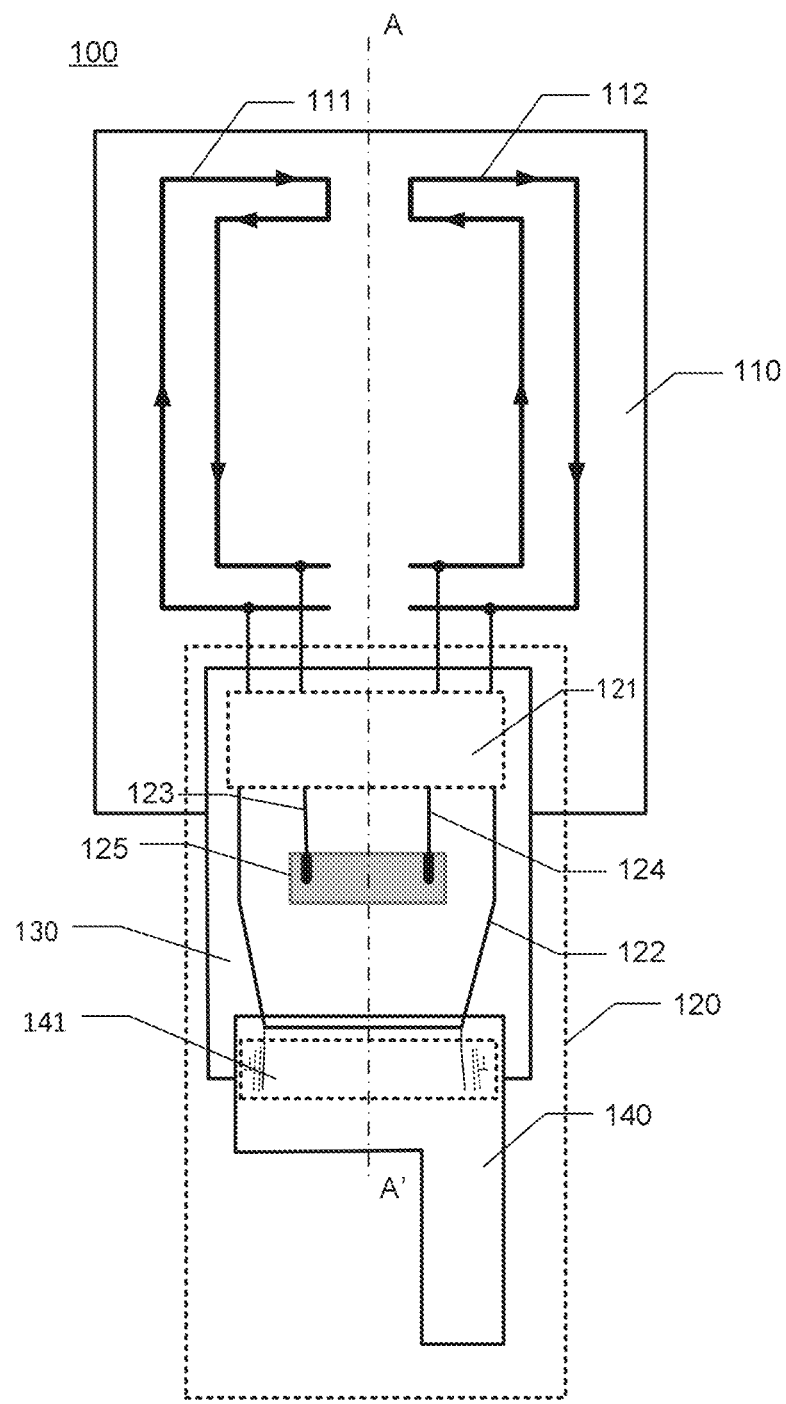
FIG. 1B schematically shows an exemplary structure diagram of a display device according to another embodiment of the present disclosure.

FIG. 1B schematically shows an exemplary structure diagram of a display device according to another embodiment of the present disclosure. Compared with the display device shown in FIG. 1A, FIG. 1B illustrates a structure and a wiring situation of the circuit board 120 as an example.

Figure 1C:
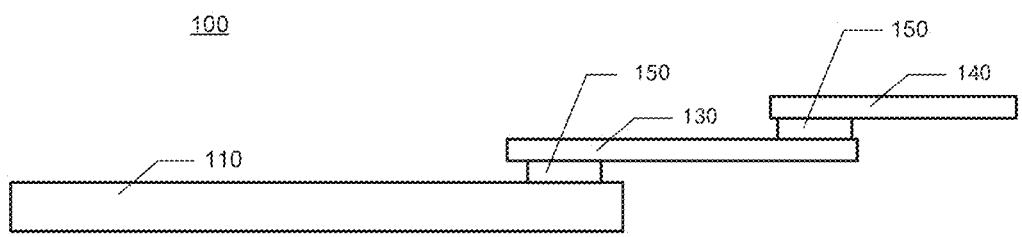
FIG. 1C schematically shows an example A-A' cross-sectional view of a display device according to an embodiment of the present disclosure.

FIG. 1C schematically shows a cross-sectional view of an example A-A' of the display device shown in FIG. 1B.

Exemplarily, the circuit board 120 may include a first circuit board 130 and a second circuit board 140. The second circuit board 140 may be, for example, a flexible printed circuit (FPC) 140.

The first circuit board 130 is provided with a first bonding area 121 for bonding with the display panel 110, and the second circuit board 140 is provided with a second bonding area 141 for bonding with the first circuit board 130. The first connection line 122 is located on the first circuit board 130 and the second circuit board 140, and the second connection line 123, the third connection line 124, and the integrated circuit 125 are located on the first circuit board 130. The first circuit board 130 and the display panel 110, and the second circuit board 140 and the first circuit board 130 may be bonded through a predetermined process. For example, in an example shown in FIG. 1C, the first circuit board 130 may be bonded to the display panel 110 through, for example, ACF (Anisotropic Conductive Film) 150 by using a bonding process, or the second circuit board 140 may be bonded to the first circuit board 130 through, for example, the ACF 150 by using a bonding process. In other examples, other bonding materials or other bonding methods may also be used, which is not limited herein.

A crack detection principle of the display device shown in FIG. 1B and FIG. 1C has been described in detail above, and may not be repeated here.

Figure 2A:
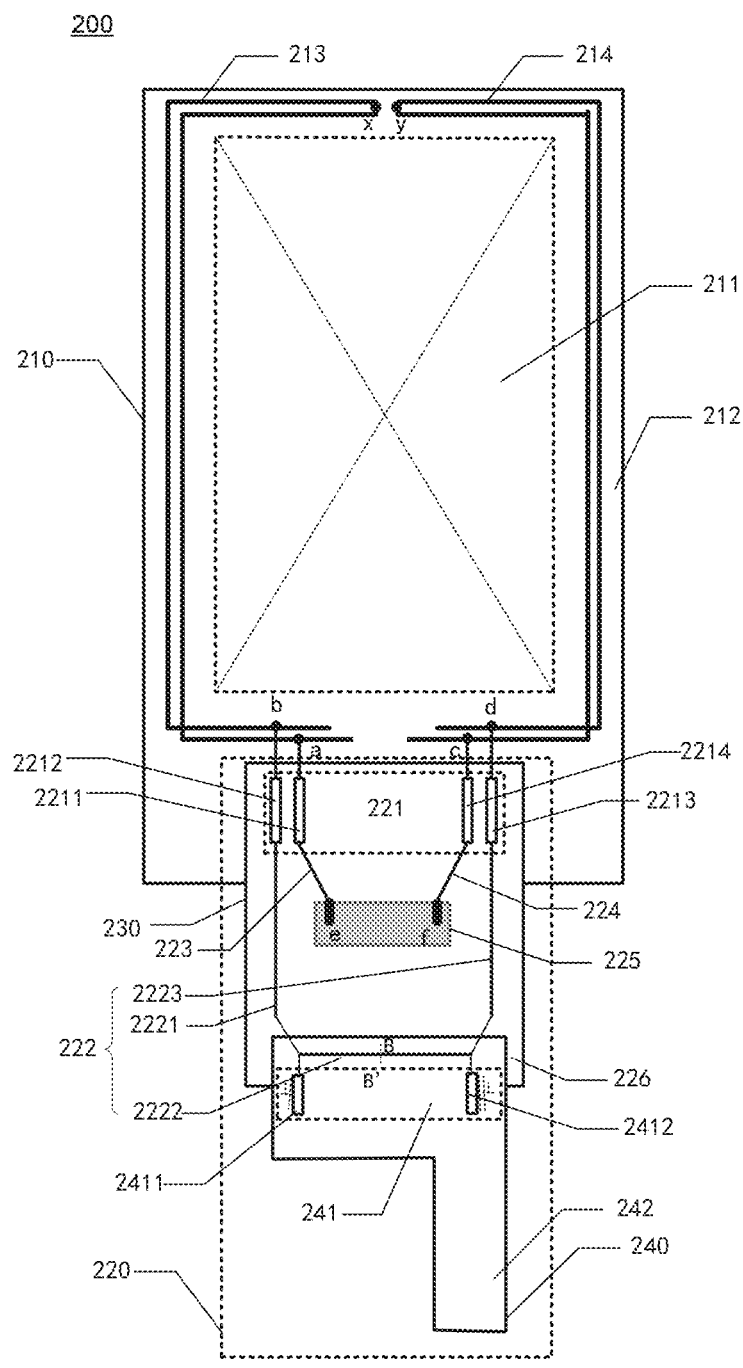
FIG. 2A schematically shows an exemplary structure diagram of a display device according to another embodiment of the present disclosure.

FIG. 2A schematically shows an exemplary structure diagram of a display device according to another embodiment of the present disclosure.

As shown in FIG. 2A, the display device 200 may include a display panel 210 and a circuit board 220, and the circuit board 220 may include a first circuit board 230 and a second circuit board 240. The first circuit board 230 may be, for example, a material board, and the second circuit board 240 may be, for example, a flexible circuit board.

The display panel 210 may include a display area (Active Area, effective display area) 211 and a peripheral area (for example, a non-display area) 212 surrounding the display area 211. Exemplarily, in order to be able to detect whether a crack exists in the peripheral area 212 of the display panel 210 or not, a first wire segment 213 and a second wire segment 214 may be provided in the peripheral area 212. For example, the first wire segment 213 and the second wire segment 214 may be arranged around the display area 211 of the display panel 210. For example, the display area 211 includes a first boundary, a second boundary, a third boundary, and a fourth boundary that are sequentially connected. The first wire segment 213 is located in the peripheral area 212 close to the first boundary, the second boundary, and the third boundary. The second wire segment 214 is located in the peripheral area 212 close to the first boundary, the fourth boundary, and the third boundary. The first wire segment 213 and the second wire segment 214 may be symmetrically arranged. According to an embodiment of the present disclosure, the first wire segment 213 may be bent to form a double-fold line, and the second wire segment 214 may also be bent to form a double-fold line. A bending point x of the first wire segment 213 and a bending point y of the second wire segment 214 are both located in the peripheral area 212 of the display panel 210 close to the first boundary, and the two bending points are not connected. The double-fold line formed by bending the first wire segment 213 extends along a part of the peripheral area close to the first boundary, the peripheral area close to the second boundary, and a part of the peripheral area close to the third boundary, so that a first end a of the first wire segment 213 and a second end b of the first wire segment 213 are located in the peripheral area close to the third boundary. The double-fold line formed by bending the second wire segment 214 extends along another part of the peripheral area close to the first boundary, the peripheral area close to the fourth boundary, and another part of the peripheral area close to the third boundary, so that a first end c of the second wire segment 214 and a second end d of the second wire segment 214 are located in the peripheral area close to the third boundary. In other embodiments, the crack detection line may form multiple loops around the display area, and accordingly have two or more bending points, which is not limited here. It may be understood that in this embodiment, in a manner of the first wire segment and the second wire segment are respectively bent into double-fold lines and then arranged around the limited display area, on the one hand, a detection accuracy may be improved by increasing the winding; on the other hand, a tension on the first wire segment and the second wire segment is increased, and this tension may pull the two ends of the breakpoint apart when the wire segment breaks, which may prevent a phenomenon of the two ends of the breakpoint still overlaps when the display panel has a small crack.

In an example shown in FIG. 2A, the first boundary may be an upper boundary of the display area 211 shown in FIG. 2A, and a part of the peripheral area close to the first boundary may be a left half of the upper peripheral area, and another part of the peripheral area close to the first boundary may be a right half of the upper peripheral area. The second boundary may be a left boundary of the display area 211 shown in FIG. 2A. The third boundary may be a lower boundary of the display area 211 shown in FIG. 2A, a part of the peripheral area close to the third boundary may be a left half of a lower peripheral area, and another part of the third boundary may be a right half of the lower peripheral area. The fourth boundary may be a right boundary of the display area 211 shown in FIG. 2A. In other examples, a position and a corresponding relationship of each boundary of the above-mentioned display area may be changed according to shapes and placement directions of the display panel 210, which is not limited here.

Figure 2B:
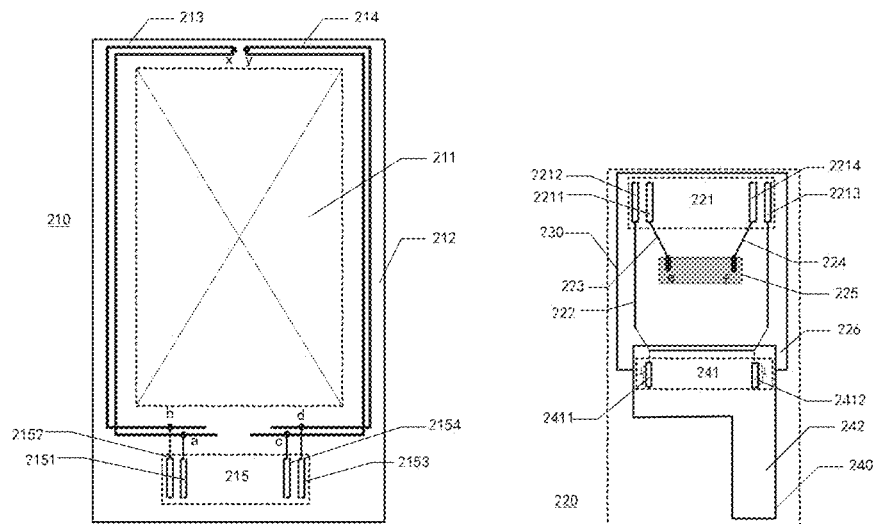
FIG. 2B schematically shows an exemplary structure diagram of a display device according to another embodiment of the present disclosure.
Figure 2C:
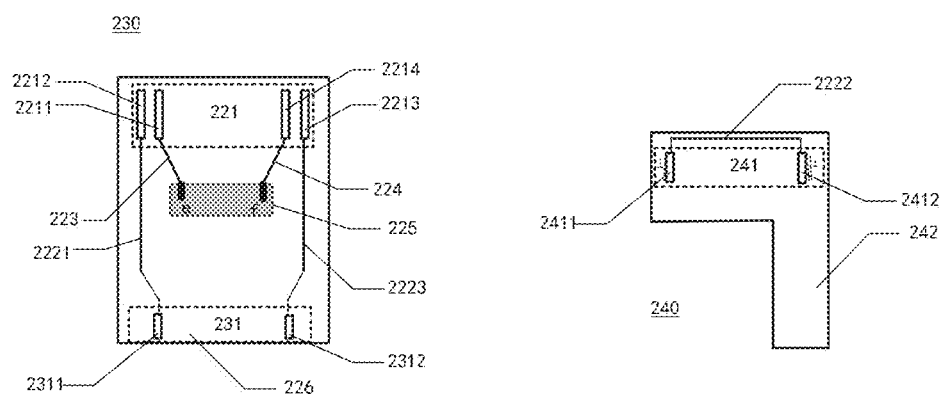
FIG. 2C schematically shows an exemplary structure diagram of a display device according to another embodiment of the present disclosure.

The circuit board 220 is provided with a first bonding area 221, and the first bonding area 221 is located on the first circuit board 230. The display panel 210 also has a corresponding bonding area for bonding with a bonding area 221 of the first circuit board 230, for example, bonded as shown in FIG. 1C. The second circuit board 240A is provided with a second bonding area 241. The first circuit board 230 also has another bonding area (for example, a third bonding area) different from the first bonding area 221 to be bonded to a second bonding area 241 of the second circuit board 240, for example, bonded as shown in FIG. 1C. FIG. 2B shows the display panel 210 and the circuit board 220 in FIG. 2A separately. As shown in FIG. 2B, a bonding area 215 of the display panel 210 shown on the left may be located in the peripheral area of the display panel 210 close to the third boundary, so that the first bonding area 221 of the first circuit board 230 shown on the right bonded to the bonding area 215 of the display panel 210 is also located in the peripheral area of the display panel 210 close to the third boundary, for example, in the lower peripheral area. FIG. 2C shows the first circuit board 230 and the second circuit board 240 in FIGS. 2A and 2B separately. As shown in FIG. 2C, a third bonding area 231 of the first circuit board 230 shown on the left may be located on a side of the first circuit board 230 away from the display panel 210, so that the bonding area 241 of the second circuit board 240 bonded to the first circuit board 230 is located on a side of the first circuit board 230 away from the display panel 210, for example, bonded to a lower side of the first circuit board 230.

The first bonding area 221 of the first circuit board 230 is provided with a first pin 2211, a second pin 2212, a third pin 2213, and a fourth pin 2214. The first circuit board 220 is further provided with a part of the first connection line 222, the second connection line 223, the third connection line 224, and the integrated circuit 225 outside the first bonding area 221. The first connection line 222 may include a fourth connection line 2221, a fifth connection line 2222, and a sixth connection line 2223 that are electrically connected in sequence. As shown in FIGS. 2A and 2B, the display device in this example adopts a layout in which the first connection line is arranged around the second connection line, the third connection line, and the integrated circuit as shown in FIG. 1B. For example, in the first connection line, the fourth connection line 2221 and the sixth connection line 2223 are located on the first circuit board 230, and the fifth connection line 2222 is located on the second circuit board 240. In other embodiments of the present disclosure, a layout in which the first connection line is arranged in an area surrounded by the second connection line, the third connection line, and the integrated circuit as shown in FIG. 1A may also be adopted, and in this layout, the four connection line 2221, the fifth connection line 2222, and the sixth connection line 2223 may all be located on the first circuit board.

As shown in FIG. 2A, the second bonding area 241 of the second circuit board 240 is provided with a fifth pin 2411 and a sixth pin 2412. A first end of the fourth connection line 2221 is electrically connected to the second pin 2212, and a second end of the fourth connection line 2221 is electrically connected to the fifth pin 2411. A first end of the fifth connection line 2222 is electrically connected to the fifth pin 2411, and a second end of the fifth connection line 2222 is electrically connected to the sixth pin 2412. A first end of the sixth connection line 2223 is electrically connected to the sixth pin 2412, and a second end of the sixth connection line 2223 is electrically connected to the third pin 2213.

A connection manner of the first circuit board 230 and the second circuit board 240 may be exemplarily described below with reference to FIG. 2C. As shown in FIG. 2C, the third bonding area 231 of the first circuit board 230 is further provided with a seventh pin 2311 and an eighth pin 2312, and the second end of the fourth connection line 2221 is electrically connected to the seventh pin 2311, the first end of the sixth connection line 2223 is electrically connected to the eighth pin 2312. When the first circuit board 230 and the second circuit board 240 are bonded together, the seventh pin 2311 and the eighth pin 2312 are electrically connected to the fifth pin 2411 and the sixth pin 2412, respectively. Thereby, the second end of the fourth connection line 2221 is electrically connected to the first end of the fifth connection line 2222, and the second end of the fifth connection line 2222 is electrically connected to the first end of the sixth connection line 2223 to form the first connection line 222.

The first bonding area 221, the third bonding area 231, the first pin 2211, the second pin 2212, the third pin 2213, the fourth pin 2214, the fourth connection line 2221 and the sixth connection line 2223 of the first connection line 222, the second connection line 223, the third connection line 224, the seventh pin 2311, the eighth pin 2312, and the integrated circuit 225 are all arranged on a substrate 226 of the first circuit board 230. The second bonding area 241, the fifth connection line 2222 of the first connection line 222, the fifth pin 2411, and the sixth pin 2412 are all arranged on the second circuit board 240. If the second circuit board 240 is a flexible circuit board, the second bonding area 241, the fifth connection line 2222, the fifth pin 2411, and the sixth pin 2412 are all arranged on a flexible substrate 242.

In an example shown in FIG. 2A, the first pin 2211, the second pin 2212, the third pin 2213, and the fourth pin 2214 are arranged in the first bonding area 221 along an extension direction of the third boundary of the display panel 210. The first pin 2211 and the fourth pin 2214 are located between the second pin 2212 and the third pin 2213. The first connection line 222 is arranged around the second connection line 223, the third connection line 224, and the integrated circuit 225.

According to an embodiment of the present disclosure, a detection loop for detecting cracks in the display panel 210 may be formed by connecting various wire segments and connection lines with the integrated circuit 225 through various pins. A first end a of the first wire segment 213 is electrically connected to the first pin 2211, and a second end b of the first wire segment 213 is electrically connected to the second pin 2212. A first end c of the second wire segment 214 is electrically connected to the fourth pin 2214, and a second end d of the second wire segment 214 is electrically connected to the third pin 2213. The second pin 2212 and the third pin 2213 are electrically connected through the first connection line 222, so that the second end b of the first wire segment 213 and the second end d of the second wire segment 214 are electrically connected to each other, thereby forming a conductive path. The first pin 2211 is electrically connected to a first test terminal e of the integrated circuit 225 through the second connection line 223, and the fourth pin 2214 is electrically connected to a second test terminal f of the integrated circuit 225 through the third connection line 224. Thus, a detection loop from the integrated circuit 225 back to the integrated circuit 225 via the second connection line 223, the first wire segment 213, the first connection line 222, the second wire segment 214, and the third connection line 224 is formed. Exemplarily, the first test terminal e of the integrated circuit 225 transmits a first signal to the first end a of the first wire segment 213 through the second connection line 223, and the signal is transmitted through the conductive path described above. The second test terminal f of the integrated circuit 225 receives a second signal from the first end c of the second wire segment 214 through the third connection line 224. The integrated circuit 225 may determine whether a breakpoint exists in the above-mentioned conductive path or not based on a difference between the first signal and the second signal. For example, the integrated circuit 225 detects whether a voltage difference between the first signal and the second signal is greater than a predetermined threshold or not, and if yes, it is determined that a breakpoint exists in the above-mentioned conductive path, thereby determining that the display panel 210 has a crack.

In order to realize an electrical connection between the wire segments in the display panel 210 and the pins in the first circuit board 230, as shown in FIG. 2B, the bonding area 215 of the display panel 210 may be provided with a ninth pin 2151, a tenth pin 2152, an eleventh pin 2153, and a twelfth pin 2154. Exemplarily, the first end a of the first wire segment 213 is electrically connected to the ninth pin 2151, and the second end b of the first wire segment 213 is electrically connected to the tenth pin 2152. The first end c of the second wire segment 214 is electrically connected to the twelfth pin 2154. The second end d of the second wire segment 214 is electrically connected to the eleventh pin 2153. The bonding area 215 of the display panel 210 is bonded to the first bonding area 231 of the first circuit board 230, so that the ninth pin 2151, the tenth pin 2152, the eleventh pin 2153, and the twelfth pin 2154 are electrically connected to the first pin 2211, the second pin 2212, the third pin 2213, and the fourth pin 2214, respectively.

Figure 2D:
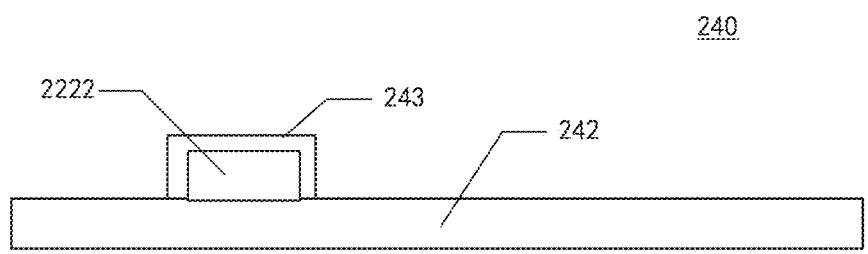
FIG. 2D schematically shows an example B-B' cross-sectional view of a flexible circuit board according to another embodiment of the present disclosure.

FIG. 2D schematically shows a cross-sectional view of the second circuit board of FIG. 2A along line B-B'. FIG. 2D illustrates the fifth connection line 2222 of the second circuit board 240 in FIG. 2A. In other embodiments, other connection lines (for example, the second connection line 223, the third connection line 224, the fourth connection line 2221, and the sixth connection line 2223, etc.) on the first circuit board may have a similar layer structure.

As shown in 2D, the second circuit board 240 may be a flexible circuit board, and the fifth connection line 2222 is arranged on the flexible substrate 242. The second circuit board 240 may further include a protective layer 243. Taking the fifth connection line 2222 as an example, the protective layer 243 may be covered on the fifth connection line 2222. For example, the flexible substrate may be made of polyimide (PI), and for example, the protective layer 243 may be made of a nickel material, and for example, the fifth connection line 2222 may be made of a copper material. The protective layer 243 may be arranged conformally to the fifth connection line 2222, or may be implemented as a flat layer. The second connection line 223 and the third connection line 224 may also be covered with a protective layer in a same manner.

According to an embodiment of the present disclosure, the integrated circuit 225 described above may be implemented in a driving chip in the display device 200, and the driving chip may be arranged on the first circuit board 230 through a COF (Chip on Film) process. For example, a typical Subtractive Process substrate manufacturing process may be used to prepare the substrate 226 of the first circuit board 230, and a driving chip may be flip-chip bonded on the substrate to obtain a COF encapsulation.

Figure 3:
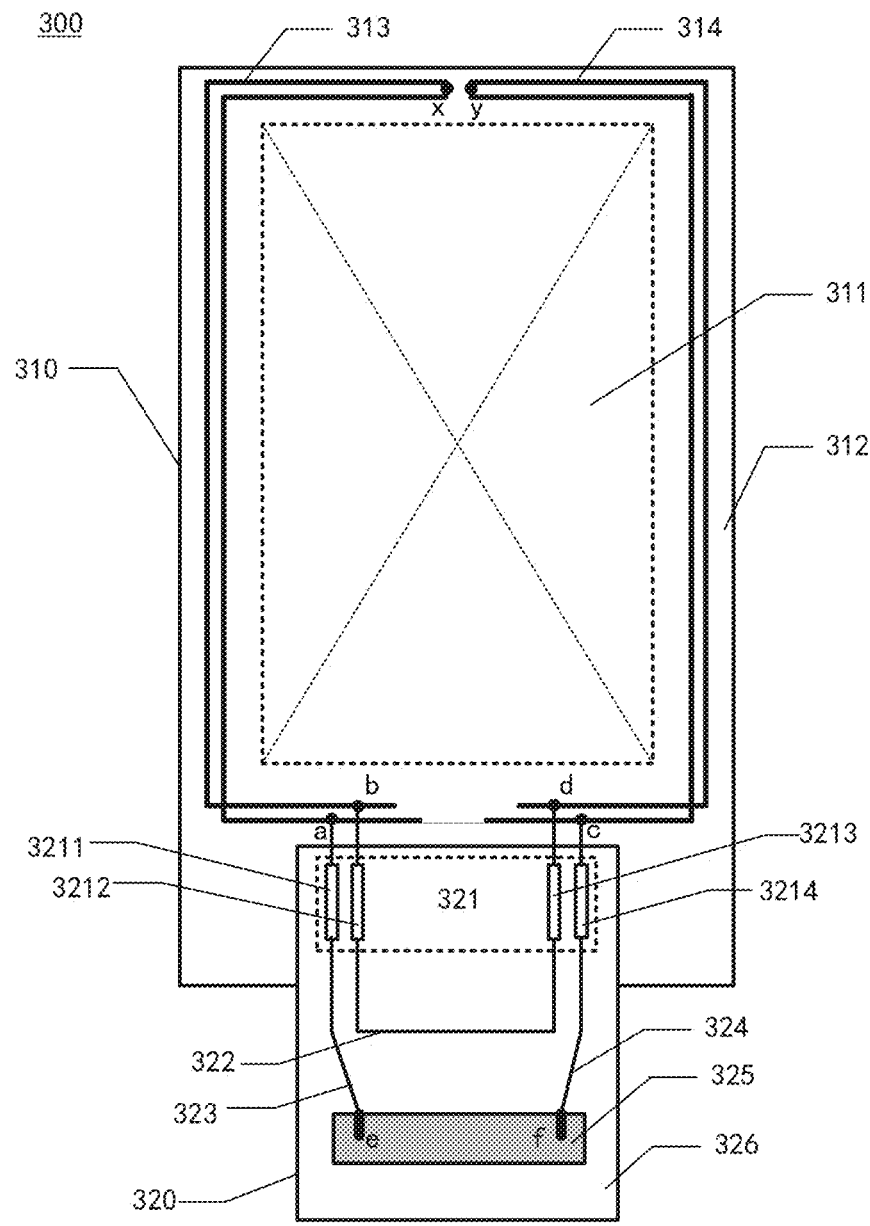
FIG. 3 schematically shows an exemplary structure diagram of a display device according to another embodiment of the present disclosure.

FIG. 3 schematically shows an exemplary structure diagram of a display device according to another embodiment of the present disclosure.

As shown in FIG. 3, the display device 300 may include: a display panel 310 and a circuit board 320. A specific structure of the circuit board 320 may be the same as the circuit board 220 shown in FIGS. 2A to 2C, for example, the circuit board 320 includes a first circuit board and a second circuit board. An arrangement of the first circuit board and the second circuit board has been described in detail above, and may not be repeated here.

The display panel 310 may include a display area 311 and a peripheral area 312 surrounding the display area 311. A crack detection line is provided on the peripheral area 312, and the crack detection line includes a first wire segment 313 and a second wire segment 314. An arrangement of the first wire segment 313 and the second wire segment 314 on the display panel 310 may be the same as the arrangement of the first wire segment 213 and the second wire segment 214 on the display panel 210 in FIG. 2A, and may not be repeated here.

The circuit board 320 is provided with a bonding area 321. Based on the layout of the wire segments on the display panel 310, the bonding area 321 of the flexible circuit board 320 may be bonded to the display panel 310 at a third boundary of the display panel 310. A bonding manner may be the same as the bonding manner between the display panel 210 and the first circuit board 230 in FIG. 2A, and may not be repeated here. The bonding area 321 is provided with a first pin 3211, a second pin 3212, a third pin 3213, and a fourth pin 3214. The circuit board 320 is further provided with a first connection line 322, a second connection line 323, a third connection line 324, and an integrated circuit 325 outside the bonding area 321. The aforementioned bonding area 321, the first pin 3211, the second pin 3212, the third pin 3213, the fourth pin 3214, the first connection line 322, the second connection line 323, the third connection line 324, and the integrated circuit 325 are all arranged on a substrate 326 of the circuit board 320.

In an example shown in FIG. 3, the first pin 3211, the second pin 3212, the third pin 3213, and the fourth pin 3214 are arranged in the bonding area 321 along an extension direction of the third boundary of the display area 311. The second pin 3212 and the third pin 3213 are located between the first pin 3211 and the fourth pin 3214. The first connection line 322 is located in an area of the circuit board 320 surrounded by the bonding area 321, the second connection line 323, and the third connection line 324, and the integrated circuit 325. In this case, the aforementioned bonding area 321, the first pin 3211, the second pin 3212, the third pin 3213, the fourth pin 3214, the first connection line 322, the second connection line 323, and the third connection line 324, and the integrated circuit 325 are all arranged on a substrate of the first circuit board of the circuit board 320.

According to an embodiment of the present disclosure, a detection loop for detecting cracks in the display panel 320 may be formed by a following connection method: a first end a of the first wire segment 313 is electrically connected to the first pin 3211, and a second end b of the first wire segment 313 is electrically connected to the second pin 3212. A first end c of the second wire segment 314 is electrically connected to the fourth pin 3214, and a second end d of the second wire segment 314 is electrically connected to the third pin 3213. The second pin 3212 and the third pin 3213 are electrically connected through the first connection line 322, so that the second end b of the first wire segment 313 and the second end d of the second wire segment 314 are electrically connected to each other, thereby forming a conductive path. The first pin 3211 is electrically connected to a first test terminal e of the integrated circuit 325 through the second connection line 323, and the fourth pin 3214 is electrically connected to a second test terminal f of the integrated circuit 325 through the third connection line 324. Thus, a detection loop is formed from the integrated circuit 225 via the second connection line 323, the first wire segment 313, the first connection line 322, the second wire segment 314, and the third connection line 324, and then back to the integrated circuit 325. Exemplarily, the first test terminal e of the integrated circuit 325 transmits a first signal to the first end a of the first wire segment 313 through the second connection line 323, and the signal is transmitted through the conductive path described above. The second test terminal f of the integrated circuit 325 receives a second signal from the first end c of the second wire segment 314 through the third connection line 324. The integrated circuit 325 is used to determine whether a breakpoint exists in the above-mentioned conductive path or not based on a difference between the first signal and the second signal. For example, the integrated circuit 325 detects whether a voltage difference between the first signal and the second signal is greater than a predetermined threshold or not, and if yes, it is determined that a breakpoint exists in the above-mentioned conductive path, and then it is determined that the display panel 310 has a crack.

According to an embodiment of the present disclosure, a layout of any connection line in the circuit board 320 may be the same as the layout shown in FIGS. 2A to 2D, and an encapsulation manner of the integrated circuit 325 in the circuit board 320 may also be the same as that of the above integrated circuit 225, and may not be repeated here.

Figure 4:
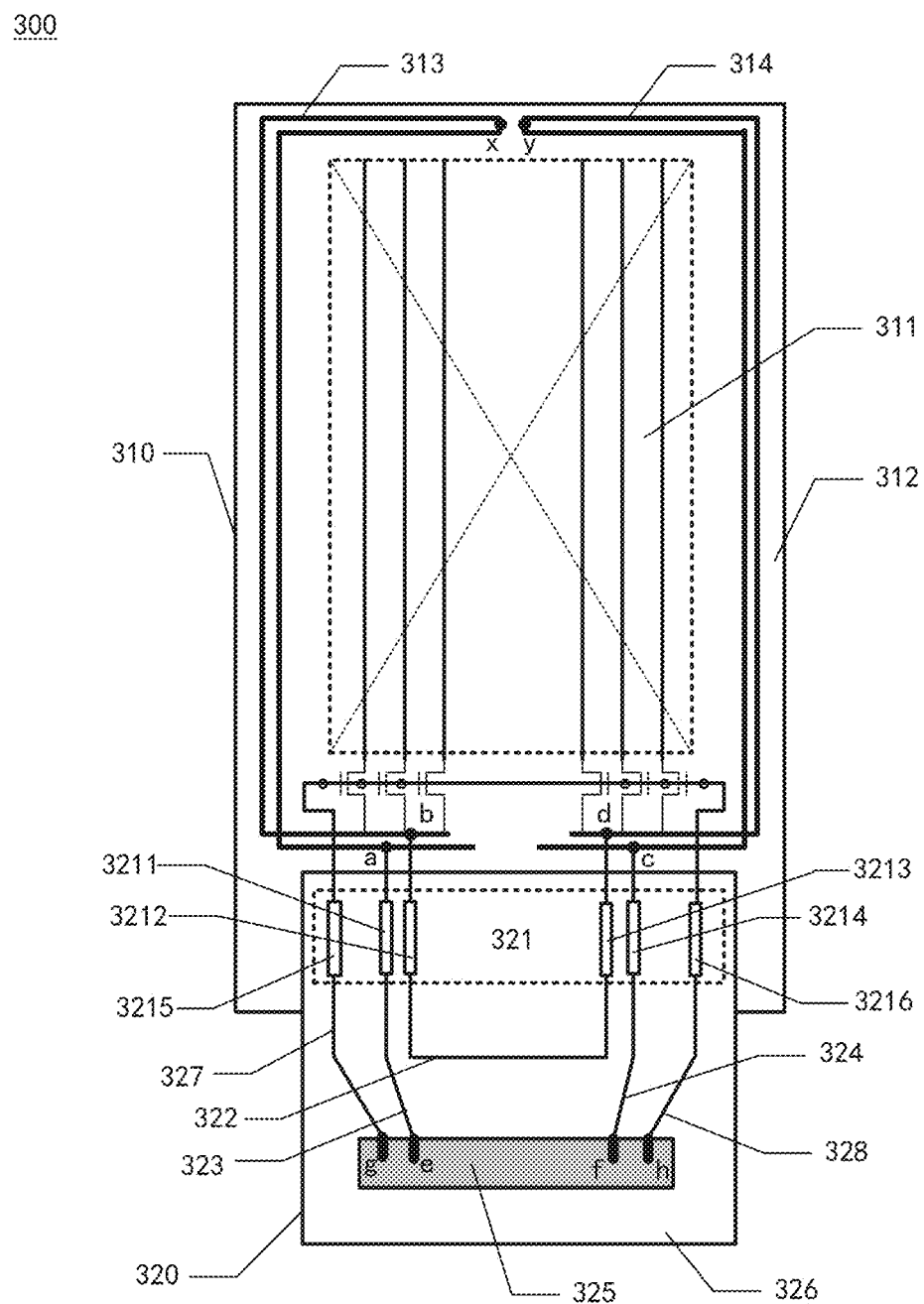
FIG. 4 schematically shows an exemplary structure diagram of a display device according to another embodiment of the present disclosure.

FIG. 4 schematically shows an exemplary structure diagram of a display device according to another embodiment of the present disclosure. A difference between the display device shown in FIG. 4 and the display device shown in FIG. 3 above is that on a basis of the display device shown in FIG. 3, detection switches provided to detect pixels in the display panel may also be used to perform a crack detection of the display panel to make a crack detection result more intuitive and easier for an inspection personnel to identify. Only differences are explained below.

As shown in FIG. 4, the display panel 310 further includes a plurality of detection switches, such as TFT (Thin Film Transistor) detection switches. The bonding area 321 of the circuit board 320 is also provided with a thirteenth pin 3215 and a fourteenth pin 3216. Accordingly, the bonding area of the display panel is also provided two pins electrically connected to the thirteenth pin 3215 and the fourteenth pin 3216, respectively, and the circuit board 320 is further provided with a seventh connection line 327 and an eighth connection line 328 outside the bonding area 321. A part of the plurality of TFT detection switches (for example, three TFT detection switches) is located in a part of the peripheral area close to the third boundary of the display panel 310 (for example, a left half of the lower peripheral area), and the other part of the plurality of TFT detection switches (for example, the other three TFT detection switches) is located at another part (for example, a right half) of the third boundary of the display panel 310. Exemplarily, control electrodes of the plurality of TFT detection switches are electrically connected to at least one of the thirteenth pin 3215 and the fourteenth pin 3216, and the thirteenth pin 3215 is electrically connected to a first control terminal g of the integrated circuit 325 through the seventh connection line 327, and the fourteenth pin 3216 is electrically connected to a second control terminal h of the integrated circuit 325 through the eighth connection line 328. Both the first control terminal g and the second control terminal h of the integrated circuit 225 may output an effective level to control the plurality of TFT detection switches to be in an on state. First electrodes of the three TFT detection switches located in a part of the third boundary of the display panel 210 are all electrically connected to a second end b of the first wire segment 313, and second electrodes of the three TFT detection switches located in a part of the third boundary of the display panel 310 are electrically connected to three columns of pixels located in a part (for example, a left half) of the display area 311, respectively. First electrodes of the other three TFT detection switches located in another part of the third boundary of the display panel 310 are all electrically connected to a second end d of the second wire segment 314, and second electrodes of the other three TFT detection switches located in another part of the third boundary of the display panel 310 are electrically connected to three columns of pixels located in another part (for example, a right half) of the display area 311, respectively.

In an example shown in FIG. 4, during a crack detection of the display panel 310, a driving signal for normal display of the display panel 310 is not provided to the display panel 310, and the integrated circuit 325 outputs data signals at the first test terminal e and the second test terminal f, and the integrated circuit 325 outputs first control signals at the first control terminal g and the second control terminal h. A data signal output by the first test terminal e is transmitted to three TFT detection switches on the left through the first wire segment 313, and a data signal output by the second test terminal f is transmitted to three TFT detection switches on the right through the second wire segment 314. If the display panel 310 has no cracks, a column of pixels in the figure displays a black screen. If the display panel 310 has a crack in a peripheral area distributed by the first wire segment 313, three columns of pixels on the left display bright lines. If the display panel 310 has a crack in a peripheral area distributed by the second wire segment 314, three columns of pixels on the right display bright lines. Therefore, it is possible to determine whether a crack exists in the display panel 310 or not and an approximate location of the crack according to a display situation of bright lines on the display panel 310. After the above-mentioned crack detection is completed, in a subsequent use process, the first control terminal g and the second control terminal h of the integrated circuit 325 output second control signals to control the plurality of TFT detection switches to be in an off state, without affecting the normal use of the display panel 310.

It may be understood that the number and positions of the aforementioned TFT detection switches and the number and positions of the selected columns of pixels may be set as required. Based on the same principle, on the basis of the display device shown in FIG. 2A, the TFT detection switch may also be used to perform crack detection of the display panel, which may not be repeated here.

Figure 5:
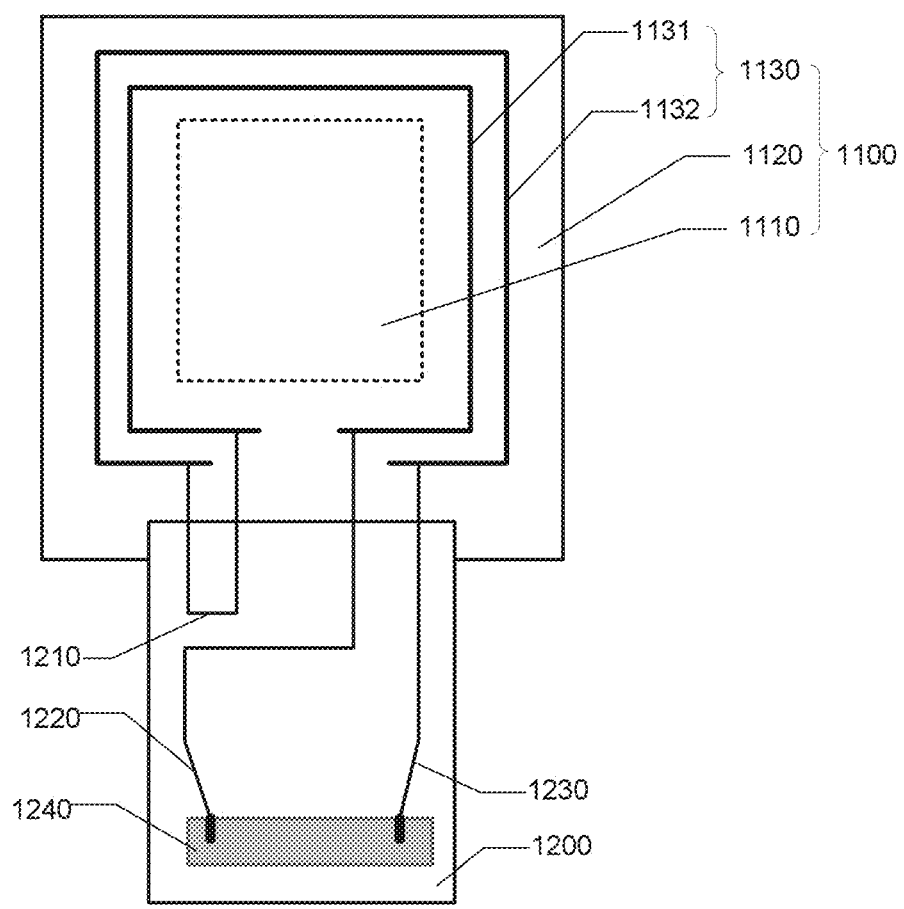
FIG. 5 schematically shows an exemplary structure diagram of a display device according to another embodiment of the present disclosure.

FIG. 5 schematically shows an exemplary structure diagram of a display device according to another embodiment of the present disclosure.

As shown in FIG. 5, the display device 1000 may include: a display panel 1100, a circuit board 1200, and a crack detection line 1130.

The display panel 1100 may include a display area 1110 and a peripheral area 1120 surrounding the display area 1110, and the crack detection line 1130 is located in the peripheral area 1120 and surrounds the display area 1110. The crack detection line 1130 may include a first wire segment 1131 and a second wire segment 1132.

The circuit board 1200 is located on a side of the display panel 1100 and at least partially overlaps the display panel 1100. The circuit board 1200 may include a plurality of connection lines, and the plurality of connection lines include at least one first connection line 1210, at least one second connection line 1220, and at least one third connection line 1230. The circuit board 1200 may also include an integrated circuit 1240. The connection lines 1210 to 1230 and the integrated circuit 1240 are all located on a side of the circuit board 1200 away from the display area 1110. As shown in FIG. 5, the at least one first connection line 1210 electrically connects the first wire segment 1131 and the second wire segment 1132 to form a conductive path, the at least one second connection line 1220 electrically connects the first wire segment 1131 and the integrated circuit 1240, and the at least one third connection line 1230 electrically connects the second wire segment 1132 and the integrated circuit 1240. It may be understood that the crack detection line 1130 forms a detection loop with the integrated circuit 1240 through the plurality of connection lines 1210 to 1230. A specific electrical connection method may be described later. The integrated circuit 1240 may be used to determine whether a breakpoint exists in the conductive path described above or not. For example, the integrated circuit 1240 may transmit a first signal to one end of the conductive path, and then receive a second signal from another end of the conductive path, and determine whether a breakpoint exists in the conductive path or not according to a difference between the first signal and the second signal, and if yes, it means that the above-mentioned crack detection line 1130 is broken due to a crack generated on the display panel 1100, that is, it is determined that the display panel 1100 has a crack.

According to an embodiment of the present disclosure, there is also provided a manufacturing method for manufacturing the display device as described in any of the above embodiments. The following is an exemplary description with reference to FIG. 6. It should be noted that a sequence number of each step in a following method is only used to indicate the step for description, and should not be regarded as indicating an execution order of the various steps. Unless explicitly stated otherwise, the method need not be performed exactly in the order shown.

Figure 6:
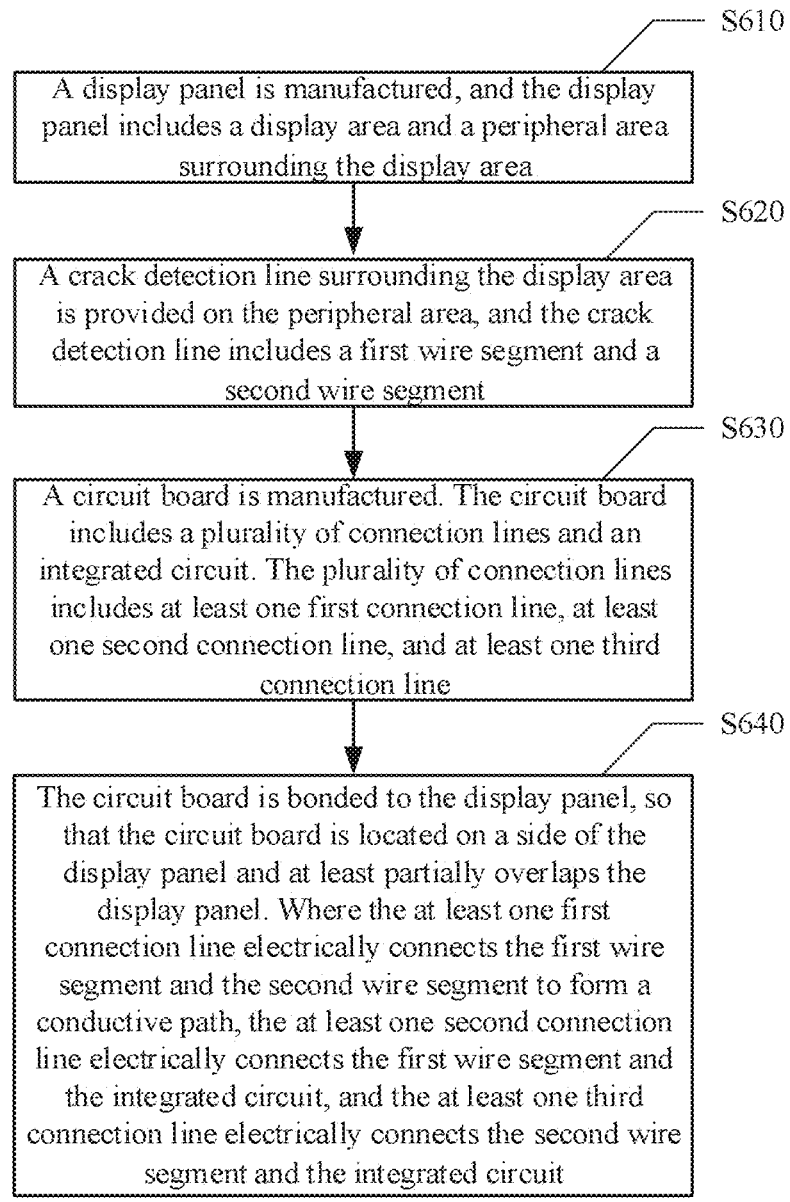
FIG. 6 schematically shows an exemplary flowchart of a method for manufacturing a display device according to an embodiment of the present disclosure.

FIG. 6 schematically shows an example flowchart of a method for manufacturing a display device according to an embodiment of the present disclosure.

As shown in FIG. 6, the method may include the following steps S610 to S640.

In step S610, a display panel is manufactured. The display panel includes a display area and a peripheral area surrounding the display area.

In step S620, a crack detection line surrounding the display area is provided on the peripheral area, and the crack detection line includes a first wire segment and a second wire segment.

In step S630, a circuit board is manufactured. The circuit board includes a plurality of connection lines and an integrated circuit. The plurality of connection lines includes at least one first connection line, at least one second connection line, and at least one third connection line.

In step S640, the circuit board is bonded to the display panel, so that the circuit board is located on a side of the display panel and at least partially overlaps the display panel. Where the at least one first connection line electrically connects the first wire segment and the second wire segment to form a conductive path, the at least one second connection line electrically connects the first wire segment and the integrated circuit, and the at least one third connection line electrically connects the second wire segment and the integrated circuit. Where the integrated circuit may be used to determine whether a breakpoint exists in the conductive path or not.

According to an embodiment of the present disclosure, a detection method that may be applied to the display device described in any of the above embodiments is also provided to detect whether a crack exists in the display panel of the display device or not. The detection process may be performed, for example, in a module process stage of the display device, and the following is an exemplary description with reference to FIG. 7. It should be noted that the sequence number of each step in a following method is only used to indicate the step for description, and should not be regarded as indicating an execution order of the various steps. Unless explicitly stated otherwise, the method need not be performed exactly in the order shown.

Figure 7:
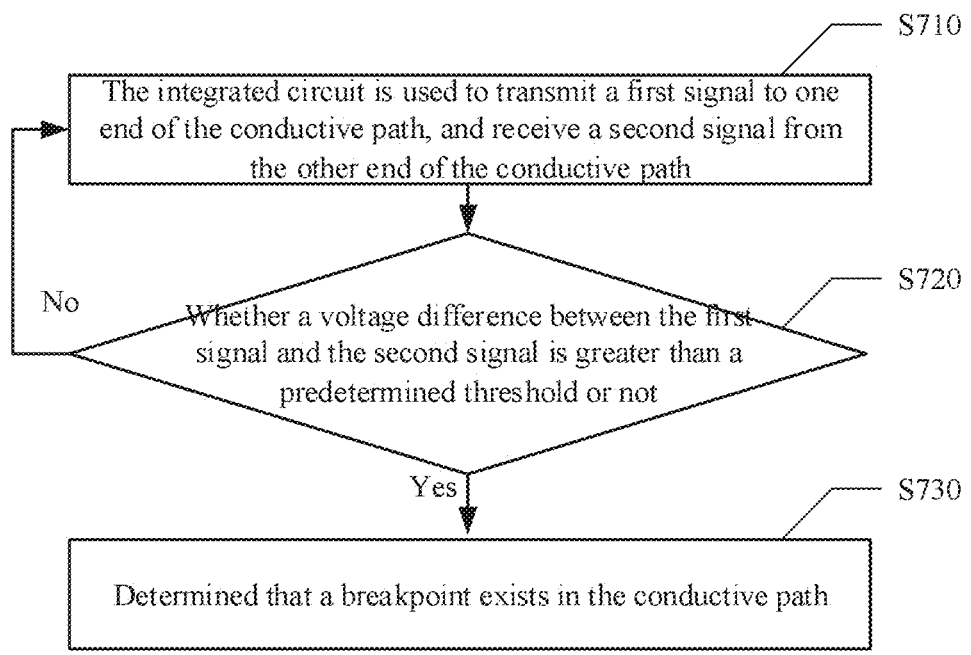
FIG. 7 schematically shows an exemplary flow chart of a detection method according to an embodiment of the present disclosure.

FIG. 7 schematically shows an example flowchart of a detection method according to an embodiment of the present disclosure.

As shown in FIG. 7, the method may include the following steps S710 to S730.

In step S710, the integrated circuit is used to transmit a first signal to one end of the conductive path, and receive a second signal from the other end of the conductive path. Where the integrated circuit and the conductive path have been separately described above, and at least one first connection line electrically connects the first wire segment and the second wire segment in the crack detection line to form a conductive path, which may not be repeated here.

In step S720, it is determined whether a voltage difference between the first signal and the second signal is greater than a predetermined threshold or not, and if yes, execute step S730, and if not, return to step S710 to repeat the detection.

In step S730, it is determined that a breakpoint exists in the conductive path. When it is determined that a breakpoint exists in the conductive path, it may be determined that the display panel of the display device has a crack.

Those skilled in the art may understand that timely detection of display panels with cracks in a process stage may not only effectively intercept defective display panels to reduce a waste of subsequent process materials, but also help inspectors analyze process stages with high occurrence of cracks, thereby improving process to reduce a rate of cracks.

According to an embodiment of the present disclosure, an electronic apparatus is also provided, which may be exemplified below with reference to FIG. 8.

Figure 8:
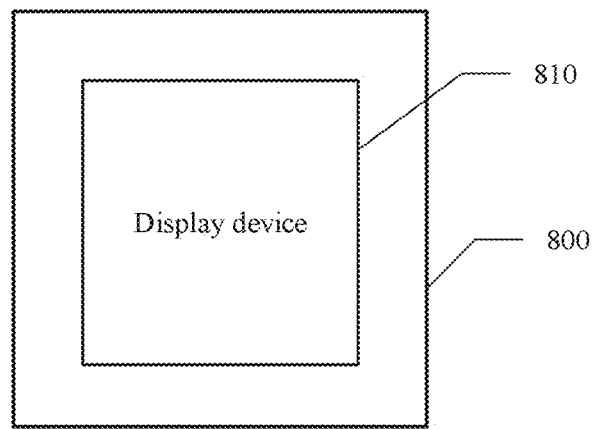
FIG. 8 schematically shows an example block diagram of an electronic apparatus according to an embodiment of the present disclosure.

FIG. 8 schematically shows an example block diagram of an electronic apparatus according to an embodiment of the present disclosure.

As shown in FIG. 8, the electronic apparatus 800 may include a display device 810, and the display device 810 may be same as any display device shown in FIGS. 1A, 1B, 1C, 2A, 2B, 2C, 2D, 3, 4, and 5, and may not be repeated here.

It should be noted that in the above description, the technical solutions of the embodiments of the present disclosure are shown only by way of example, but it does not mean that the embodiments of the present disclosure are limited to the above steps and structures. Where possible, the steps and structures may be adjusted and selected as needed. Therefore, some steps and units are not essential elements for implementing the overall inventive idea of the embodiments of the present disclosure.

So far, the present disclosure has been described in conjunction with the preferred embodiments. It should be understood that those skilled in the art may make various other changes, substitutions and additions without departing from the spirit and scope of the embodiments of the present disclosure. Therefore, the scope of the embodiments of the present disclosure is not limited to the above specific embodiments, but should be defined by the appended claims.

What is claimed is:

1. A display device, comprising:
a display panel comprising a display area and a peripheral area surrounding the display area;
a crack detection line in the peripheral area and surrounding the display area, wherein the crack detection line comprises a first wire segment and a second wire segment;
a circuit board on a side of the display panel and at least partially overlapping the display panel, wherein the circuit board comprises a plurality of connection lines and an integrated circuit, and the plurality of connection lines comprises at least one first connection line, at least one second connection line, and at least one third connection line; and
a first pin, a second pin, a third pin, and a fourth pin between the crack detection line and the plurality of connection lines,
wherein the at least one first connection line electrically connects the first wire segment and the second wire segment, the at least one second connection line electrically connects the first wire segment and the integrated circuit, and the at least one third connection line electrically connects the second wire segment and the integrated circuit;
wherein a first end of the first wire segment is electrically connected to the first pin, and a second end of the first wire segment is electrically connected to the second pin;
wherein a first end of the second wire segment is electrically connected to the fourth pin, and a second end of the second wire segment is electrically connected to the third pin;
wherein the second pin and the third pin are electrically connected to each other through the first connection line;
wherein the first pin is electrically connected to a first test terminal of the integrated circuit through the second connection line;
wherein the fourth pin is electrically connected to a second test terminal of the integrated circuit through the third connection line; and
wherein the first connection line is on the circuit board and on a side of the first pin, the second pin, the third pin and the fourth pin away from the crack detection line.

2. The display device according to claim 1, wherein the circuit board further comprises:
a first circuit board and a second circuit board, wherein the second circuit board is on a side of the first circuit board away from the display panel and at least partially overlaps the first circuit board; and
wherein the integrated circuit, the second connection line, and the third connection line are on the first circuit board.

3. The display device according to claim 2, wherein the second pin and the third pin are between the first pin and the fourth pin; and
wherein the first connection line is in an area of the first circuit board surrounded by the first pin, the second pin, the third pin, the fourth pin, the second connection line, the third connection line, and the integrated circuit.

4. The display device according to claim 2, wherein the first pin and the fourth pin are between the second pin and the third pin; and
wherein the first connection line comprises a fourth connection line, a fifth connection line, and a sixth connection line that are electrically connected in sequence, and the fourth connection line and the sixth connection line are on the first circuit board, and the fifth connection line is on the second circuit board.

5. The display device according to claim 4, further comprising a fifth pin and a sixth pin on the second circuit board; and wherein:
a first end of the fourth connection line is electrically connected to the second pin, and a second end of the fourth connection line is electrically connected to the fifth pin;
a first end of the fifth connection line is electrically connected to the fifth pin, and a second end of the fifth connection line is electrically connected to the sixth pin; and
a first end of the sixth connection line is electrically connected to the sixth pin, and a second end of the sixth connection line is electrically connected to the third pin.

6. The display device according to claim 5, further comprising a seventh pin and an eighth pin on the first circuit board away from the display panel; and
wherein the second end of the fourth connection line is electrically connected to the seventh pin, and the first end of the sixth connection line is electrically connected to the eighth pin; and
wherein the seventh pin and the eighth pin are electrically connected to the fifth pin and the sixth pin, respectively.

7. The display device according to claim 4, wherein the second circuit board is a flexible circuit board.

8. The display device according to claim 7, wherein the flexible circuit board comprises a flexible substrate, and the fifth connection line is on the flexible substrate.

9. The display device according to claim 7, wherein the flexible circuit board comprises a protective layer covering the fifth connection line.

10. The display device according to claim 9, wherein the protective layer is made of a nickel material.

11. The display device according to claim 2, wherein the display area comprises a first boundary, a second boundary, a third boundary, and a fourth boundary that are sequentially connected; and wherein:
the first wire segment is in the peripheral area close to the first boundary, the second boundary, and the third boundary;

the second wire segment is in the peripheral area close to the first boundary, the fourth boundary, and the third boundary;

the first wire segment and the second wire segment are symmetrically arranged; and the first circuit board is in the peripheral area close to the third boundary, and the first pin, the second pin, the third pin, and the fourth pin are on the first circuit board.

12. The display device according to claim 11, wherein the first wire segment is bent to form a first double-fold line, and the second wire segment is bent to form a second double-fold line; and wherein:

a bending point of the first double-fold line is in the peripheral area close to the first boundary, and a first end of the first double-fold line and a second end of the first double-fold line are in the peripheral area close to the third boundary; and a bending point of the second double-fold line is in the peripheral area close to the first boundary, and a first end of the second double-fold line and a second end of the second double-fold line are in the peripheral area close to the third boundary.

13. The display device according to claim 12, further comprising a ninth pin, a tenth pin, an eleventh pin, and a twelfth pin on the display panel close to the third boundary; and wherein:

the first end of the first wire segment and the second end of the first wire segment are electrically connected to the ninth pin and the tenth pin, respectively; and the first end of the second wire segment and the second end of the second wire segment are electrically connected to the eleventh pin and the twelfth pin, respectively; and the ninth pin, the tenth pin, the eleventh pin, and the twelfth pin are electrically connected to the first pin, the second pin, the third pin, and the fourth pin, respectively.

14. The display device according to claim 11, further comprising a ninth pin, a tenth pin, an eleventh pin, and a twelfth pin on the display panel close to the third boundary; and wherein:

the first end of the first wire segment and the second end of the first wire segment are electrically connected to the ninth pin and the tenth pin, respectively;

the first end of the second wire segment and the second end of the second wire segment are electrically connected to the eleventh pin and the twelfth pin, respectively; and the ninth pin, the tenth pin, the eleventh pin, and the twelfth pin are electrically connected to the first pin, the second pin, the third pin, and the fourth pin, respectively.

15. The display device according to claim 1, wherein the first connection line, the second connection line, and the third connection line are made of a copper material.

16. The display device according to claim 1, wherein the display panel further comprises a plurality of detection switches and a plurality columns of pixels, and the plurality columns of pixels are in the display area, and the plurality of detection switches are electrically connected to the plurality columns of pixels and the crack detection line; and wherein first electrodes of a part of the plurality of detection switches are electrically connected to the first wire segment, and first electrodes of the other part of the plurality of detection switches are electrically connected to the second wire segment;

wherein second electrodes of the plurality of detection switches are electrically connected to the plurality columns of pixels;

wherein the circuit board further comprises a thirteenth pin and a fourteenth pin on a side of the crack detection line away from the display area; and wherein control electrodes of the plurality of detection switches are electrically connected to the thirteenth pin and the fourteenth pin.

17. The display device according to claim 16, wherein the circuit board further comprises a seventh connection line and an eighth connection line; and wherein:

the thirteenth pin is electrically connected to a first control terminal of the integrated circuit through the seventh connection line; and the fourteenth pin is electrically connected to a second control terminal of the integrated circuit through the eighth connection line.

18. A method for manufacturing the display device according to claim 1, the method comprising:

manufacturing a display panel comprising a display area and a peripheral area surrounding the display area;

providing a crack detection line surrounding the display area on the peripheral area, wherein the crack detection line comprises a first wire segment and a second wire segment;

manufacturing a circuit board, wherein the circuit board comprises a plurality of connection lines and an integrated circuit, and the plurality of connection lines comprise at least one first connection line, at least one second connection line, and at least one third connection line; and bonding the circuit board to the display panel to cause the circuit board to be on a side of the display panel and at least partially overlap the display panel, wherein the at least one first connection line electrically connects the first wire segment and the second wire segment, the at least one second connection line electrically connects the first wire segment and the integrated circuit, and the at least one third connection line electrically connects the second wire segment and the integrated circuit.

19. An electronic apparatus comprising the display device according to claim 1.

* * * * *